United States Patent
Boecker et al.

(10) Patent No.: US 9,461,655 B2
(45) Date of Patent: Oct. 4, 2016

(54) PHASE INTERPOLATOR WITH PHASE TRAVERSING FOR DELAY-LOCKED LOOP

(71) Applicant: Synopsys, Inc., Mountain View, CA (US)

(72) Inventors: Charles W. Boecker, Ames, IA (US); Alvin Wang, Saratoga, CA (US); Aldo Bottelli, Redwood City, CA (US); Chethan Rao, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/409,165

(22) PCT Filed: Jun. 20, 2013

(86) PCT No.: PCT/US2013/046913
§ 371 (c)(1),
(2) Date: Dec. 18, 2014

(87) PCT Pub. No.: WO2013/192456
PCT Pub. Date: Dec. 27, 2013

(65) Prior Publication Data
US 2015/0326229 A1    Nov. 12, 2015

Related U.S. Application Data

(60) Provisional application No. 61/662,346, filed on Jun. 20, 2012.

(51) Int. Cl.
*H03L 7/08*    (2006.01)
*H03L 7/081*   (2006.01)
(Continued)

(52) U.S. Cl.
CPC ............ *H03L 7/0814* (2013.01); *H03K 5/131* (2013.01); *H03K 2005/00058* (2013.01)

(58) Field of Classification Search
CPC ..... H03L 7/0814; H03L 7/07; H03L 7/0812; H03L 7/091; H03L 7/18; H03K 5/131; H03K 5/133; H03K 5/155; H03K 2005/00052; H03K 2005/00058; H03K 7/06
USPC ........................................ 327/156, 158, 231
See application file for complete search history.

(56) References Cited

U.S. PATENT DOCUMENTS 7,642,826 B2   1/2010  Takai
8,228,704 B2   7/2012  Choo et al.
(Continued)

FOREIGN PATENT DOCUMENTS

JP    2007-243735 A    9/2007
KR    10-2008-0099568 A    11/2008

OTHER PUBLICATIONS

PCT International Search Report and Written Opinion, PCT Application No. PCT/US2013/046913, Oct. 18, 2013, 11 pages.

*Primary Examiner* — John Poos
(74) *Attorney, Agent, or Firm* — Fenwick & West LLP

(57) ABSTRACT

A system, method and computer readable storage medium are disclosed for phase interpolator to generate a single phase output clock signal based on plurality of phase-shifted component clock signals and a digital user input control signal to be utilized in combination with a delay-locked loop circuit. In one embodiment, the phase interpolator utilizes a method of phase-traversing when generating the single phase output clock signal that prevents over- or undershooting of the desired target phase of the single phase output clock signal.

19 Claims, 8 Drawing Sheets

(51) Int. Cl.
  *H03K 5/13*   (2014.01)
  *H03K 5/00*   (2006.01)

(56) References Cited

U.S. PATENT DOCUMENTS

| | | | |
|---|---|---|---|
| 8,643,414 B1 * | 2/2014 | Navid | H03L 7/10 |
| | | | 327/147 |
| 8,704,570 B2 | 4/2014 | Bottelli et al. | |
| 9,148,154 B2 | 9/2015 | Choudhary et al. | |
| 2002/0084857 A1 | 7/2002 | Kim | |
| 2004/0169539 A1 * | 9/2004 | Gauthier | H03K 5/135 |
| | | | 327/231 |
| 2007/0075877 A1 | 4/2007 | Goller et al. | |
| 2008/0231331 A1 * | 9/2008 | Balraj | G06F 1/04 |
| | | | 327/145 |
| 2010/0079180 A1 * | 4/2010 | Kim | H03K 5/13 |
| | | | 327/158 |
| 2014/0218083 A1 | 8/2014 | Choudhary et al. | |
| 2015/0244381 A9 | 8/2015 | Choudhary et al. | |

* cited by examiner

PHASE INTERPOLATOR WITH PHASE TRAVERSING FOR DELAY-LOCKED LOOP

CROSS REFERENCE TO RELATED APPLICATIONS

This application claims the benefit of U.S. Provisional Application No. 61/662,346, filed Jun. 20, 2012, which is incorporated by reference in its entirety.

BACKGROUND

1. Field of Art

The disclosure generally relates to the field of digitally controlled phase mixing in the context of delay-locked loops (DLLs) and phase-locked loops (PLLs).

2. Description of the Related Art

Delay-locked loops (DLLs) are often employed in integrated circuit devices to change the phase of a reference clock signal. In operation, a delay-locked loop generates an output clock signal based on an input clock signal to the delay-locked loop. The delay-locked loop generates an error signal by comparing the phase of the input clock signal to the phase of an output clock signal. Additionally, the delay-locked loop integrates the error signal and controls the delay of the input clock signal through a chain of delay elements based on the integrated error signal.

Phase-locked loops (PLLs) are also employed in integrated circuit devices to change the phase of a reference clock signal. Unlike a delay-locked loop, a phase-locked loop includes a voltage-controller oscillator. In operation, the phase-locked loop generates an error signal by comparing the phase of an oscillating clock signal generated by the voltage controlled oscillator with the phase of an input clock signal to the phase-locked loop. Additionally, the phase-lock loop generates a control signal for the voltage controlled oscillator by integrating the error signal. Because the control signal controls the frequency of the oscillating signal generated by the voltage controlled oscillator, the voltage controlled oscillator performs integration in the phase-locked loop. Generally, a phase-locked loop performs two integrations but a delay-locked loop performs only a single integration. Thus the phase-locked loop is a second order feedback system while the delay locked loop is a first order feedback system.

In integrated circuit implementations, a delay-locked loop adjusts the error signal generated in a feedback loop of the delay-locked loop to compensate for voltage, temperature, and process variations across the integrated circuit. Because voltage, temperature, and process variations are generally independent of each other in an integrated circuit, the error signal generated by the delay-locked loop may not adjust to all these variations quickly enough to achieve phase-lock of the output clock signal to the input clock signal. Adjustments based on analog circuitry thus have the disadvantage of not being responsive enough to those variations.

SUMMARY

Embodiments disclosed relate to a disclosed system, method and computer readable storage medium that include a phase interpolator to generate a single phase output clock signal based on plurality of component clock signals and a digital user input control signal to be utilized in combination with a delay-locked loop circuit. In a particular embodiment, the phase interpolator utilizes a method of phase-traversing when generating the single phase output clock signal that prevents over- or undershooting of the target phase of the output signal.

In one or more embodiments, the phase interpolator includes two phase multiplexers and a phase mixer coupled to the two phase multiplexers. The phase interpolator is controlled by one or more digital user input control signals that include a Gray and thermometer code. The two phase multiplexers are configured to receive a plurality of component clock signals that originate from a common clock source with the phases of each component clock signal being different. In response to the Gray code each of two phase multiplexer transmits one component clock signals to the phase mixer such that the phases of the two transmitted signals are adjacent to each other on the unit circle when the phases of all the component clock signals are mapped onto the unit circle. The phase mixer in response to the thermometer code then weighs the phases of the two transmitted signals to generate a single phase clock signal.

One or more embodiments include the method of phase-traversing from an initial clock signal to a final output clock signal. The initial clock signal has a phase that comprises the weighted phases of two component clock signals that originate from a common clock source, where the weight of phase of the first component clock signal is weight1 and of the second component clock signal is (1-weight1). The method includes the step of providing a third component clock signal that also originates from the common clock source and has a phase that is opposite to the phase of the first component clock signal relative to the phase of the second component clock on the unit circle when the phases of three component clock signals are mapped onto the unit circle. The method further includes generating an intermediate clock signal with a phase comprised of the phase of the second component clock signal, and also generating a final output clock signal. The final output clock signal has a phase comprised of the weighted phases of the second and third component clock signal, wherein the phase of the second component clock signal is weighted by weight2, and the phase of the third component clock signal is weighted by (1-weight2).

In one or more embodiments, the method for phase-traversing comprise the step of providing a initial clock signal that has a phase comprised of a phase of a first component clock signal weighted by a first factor and a phase of a second component clock signal weighted by a second factor. The method includes the step of providing a third component clock signal that has a phase opposite to the phase of the first component clock signal relative to the phase of the second component clock signal when the phases of the component clock signals are mapped onto a unit circle. The method further includes the step of generating an intermediate clock signal having the phase of the second component clock signal, and also generating the final output clock signal having a phase of the second component signal weighted by a third factor and a phase of the third component clock signal weighted by a fourth factor.

BRIEF DESCRIPTION OF DRAWINGS

The disclosed embodiments have advantages and features which will be more readily apparent from the detailed description, the appended claims, and the accompanying figures (or drawings). A brief introduction of the figures is below.

DETAILED DESCRIPTION

Figure 1A:
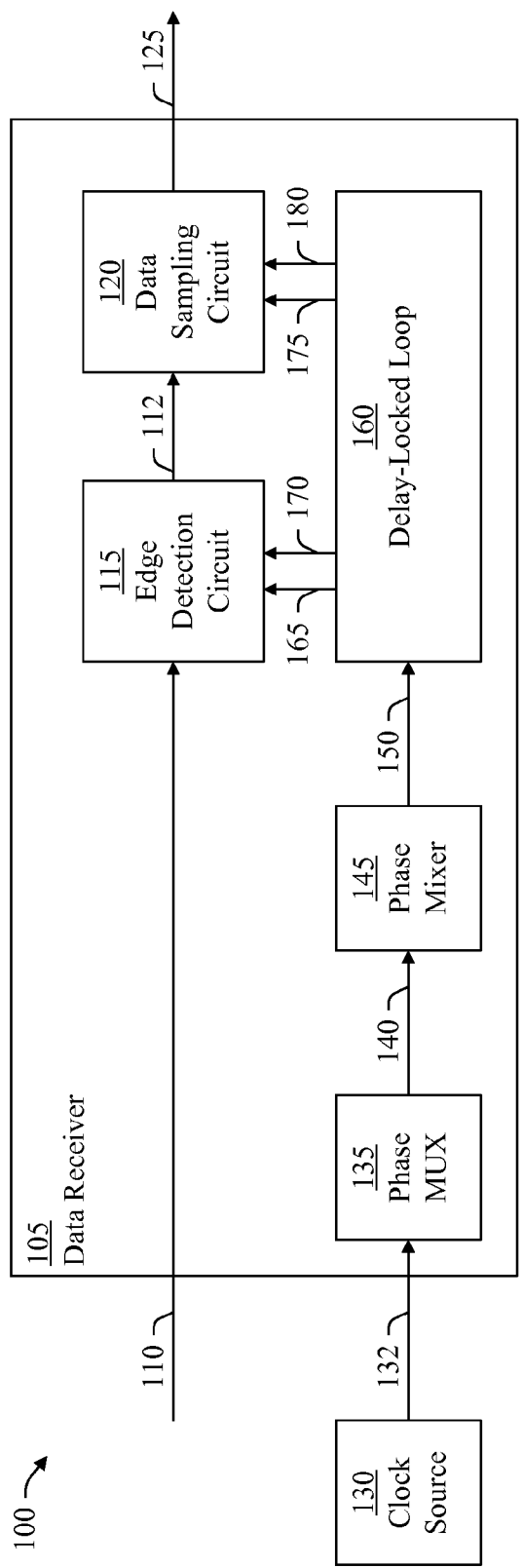
FIGS. 1A-1C illustrate a block diagrams of data receivers with phase interpolators and delay-locked loops in accordance with embodiments of the present invention.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Example embodiments disclosed herein generally relate to a receiver system for an input data stream, where the receiver system include a delay-locked loop to generate an delayed output data stream in reference of an input clock signal to the delay-locked loop. The disclosed system and/or computer readable storage medium include a phase interpolator to generate a single phase output clock signal based on plurality of component clock signals and a digital user input control signal to be utilized in combination with a delay-locked loop circuit. In one example embodiment, the phase interpolator utilizes a method of phase-traversing when generating the single phase output clock signal that prevents over- or undershooting of the target phase of the output signal.

Additional example embodiments disclosed herein relate to the method of phase-traversing from an initial clock signal to a final output clock signal. The initial clock signal comprises the weighted phases of two component clock signals from a common clock source with the weight of phase of the first component clock signal being weight1 and of the second component clock signal equaling (1-weight1). Generally, the weight of the first component clock signal phase can be a first factor, while the weight of the second component clock signal phase can be a second factor.

The method includes the step of providing a third component clock signal that also originates from the common clock source. In one example embodiment the phase offset of the third component clock signal from the second component clock signal has an absolute value that is approximately equal to the absolute value of the phase offset between the second component clock signal and the first component clock signal, while the signs of these two phase offsets are the negative of each other. Preferably, the absolute value of these two phase offsets is less than 180°. Even more preferably, the absolute value of these two phase offsets is less than 90°. In a more general example embodiment, the absolute values of these two phase offset need not be approximately equal, but still maintaining their opposite signs, thus allowing for variation of the three component signal phases.

The phases of the three component clock signals can be visualized by mapping the vectors of the component clock signals onto the unit circle, where the angle between each vector and the x-axis represents the corresponding phase value. The resulting maps then shows the third component clock signal vector being on the opposite side of the first component clock signal vector relative to the second component clock vector. The method further includes generating an intermediate clock signal with a phase comprised of the phase of the second component clock signal, and also generating a final output clock signal. The final output clock signal has a phase comprised of the weighted phases of the second and third component clock signal, wherein the phase of the second component clock signal is weighted by weight2, and the phase of the third component clock signal is weighted by (1-weight2). Generally, the weight of the second component clock signal phase can be a third factor, while the weight of the third component clock signal phase can be a fourth factor.

Phase Interpolator

FIG. 1A illustrates a receiver system 100, in accordance with an example embodiment. The receiver system 100 includes a clock source 130 and data receiver 105. The clock source 130 generates a clock signal 132 including component clock signals having phase offsets with respect to each other and provides the clock signal 132 to the data receivers 105. In addition to receiving the clock signal 132, the data receiver 105 receives a corresponding input data stream 110 and generates a corresponding output data stream 125 based on the corresponding input data stream 110 and the clock signal 132.

In addition to a delay-locked loop 160, the data receiver 105 includes an edge detection circuit 115, a data sampling circuit 120, a phase multiplexer 135 (Phase MUX), and a phase mixer 145. The phase mixer 145 in the data receiver 105 is coupled (e.g., connected) to the phase multiplexer 135 and the delay-locked loop 160 of the data receiver 105. Additionally, the delay-locked loop 160 of the data receiver 105 is coupled (e.g., connected) to the edge detection circuit 115 and the data sampling circuit 120 of the data receiver 105.

In the data receiver 105, the phase multiplexer 135 receives the clock signal 132 and selects two or more of the component clock signals 140 of the clock signal 132, for example based on a digital user input control signal (e.g., a Gray code). The phase multiplexer 135 transmits the selected component clock signals 140 to the phase mixer 145. In turn, the phase mixer 145 generates a single phase clock signal 150 by mixing the component clock signals 140 received from the phase multiplexer 135. For example, the phase mixer 145 may generate the single phase clock signal 150 by individually weighting each of the component clock signals 140 based on a digital user input control signal (e.g., a thermometer coded signal) and combining the weighted component clock signals to the single phase clock signal 150.

The delay-locked loop 160 generates a clock signal pair including the clock signals 165 and 170 and provides the clock signal pair to the edge detection circuit 115. In turn, the edge detection circuit 115 detects data edge transitions in the input data stream 110 based on the clock signal pair including the clock signal signals 165 and 170 and generates a recovered clock signal 112 based on the clock signals 165 and 170. Additionally, the delay-locked loop 160 generates a clock signal pair including the clock signals 175 and 180 and provides the clock signal pair to the data sampling circuit 120. In turn, the data sampling circuit 120 samples data bits in the input data stream 110 based on the recovered clock signal 112 and on the clock signal pair including the clock signals 175 and 180.

In some embodiments, the clock signals 175 and 180 in the clock signal pair received at the data sampling circuit 120 are delayed by circuitry in the data sampling circuit 120 so that the phases of the clock signals 175 and 180 in the clock signal pair are shifted with respect to the phases of the recovery clock signal 112. For example, the clock signals 175 and 180 in the clock signal pair may be delayed through a decision feedback equalizer (DFE) in the data sampling circuit 120. As a result, the data sampling circuit 120 does not sample data bits near a midpoint between clock edge transitions of the recovered clock signal 112. In some of these embodiments, the phase adjustment circuit in the variable delay circuit of the delay-locked loop 160 in the data receiver 105 adjusts the phase offset between the clock signal pair including the clock signals 175 and 180 while maintaining the phase offset between the clock signals 165 and 170. As a result of the adjustment to the phase offset between the two clock signal pairs, the data sampling circuit 120 samples data bits in the input data stream 110 at substantially the midpoints of the data bits between clock edge transitions of the input data stream 110 received at the data receiver 105.

Figure 1B:
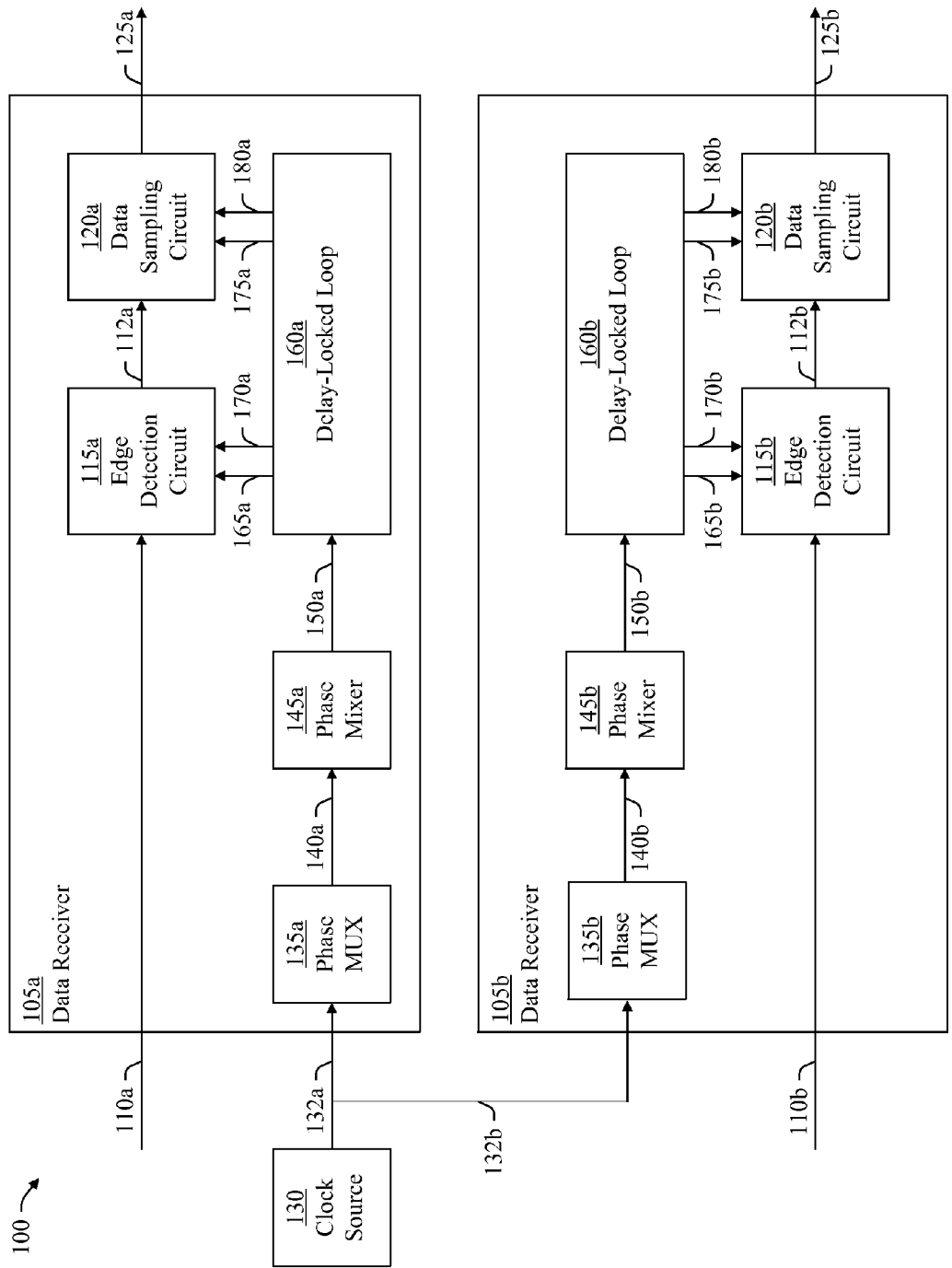

FIG. 1B illustrate an alternative example embodiment of the receiver system 100. In this embodiment, the receiver system 100 includes two data receivers 105a and 105b. The data receiver 105a includes the delay-locked loop 160a, the edge detection circuit 115a, the data sampling circuit 120a, the phase multiplexer 135a, and the phase mixer 145a. The data receiver 105b includes the delay-locked loop 160b, edge detection circuit 115b, the data sampling circuit 120b, the phase multiplexer 135b, and the phase mixer 145b. The clock source 130 generates a clock signal 132a and 132b including component clock signals having a phase offset with respect to each other and provides the clock signal 132a to data receiver 105a and clock signal 132b to data receiver 105b. In addition to receiving the clock signal 132 (e.g., clock signals 132a-b), each of the data receivers 105 (e.g., data receivers 105a-b) receives a corresponding input data stream 110 (e.g., input data streams 110a-b) and generates a corresponding output data stream 125 (e.g., output data streams 125a-b) based on the corresponding input data stream 110 and clock signal 132.

Figure 1C:
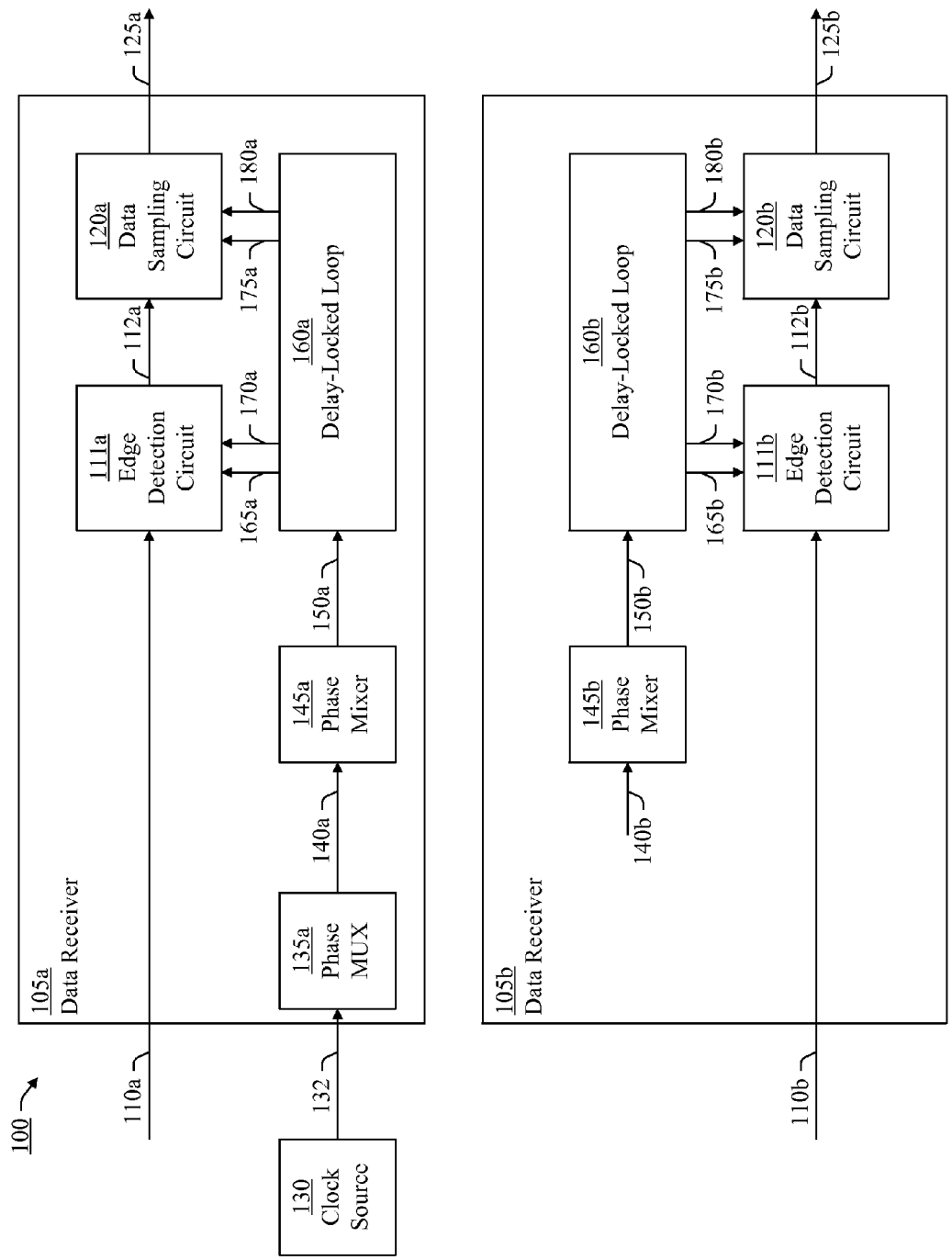

Referring to FIG. 1C, yet another example embodiment of the receiver system 100 includes two data receivers 105a and 105b, where only data receivers 105 receives the clock signal 132. Furthermore, data receiver 105b only includes the delay-locked loop 160b, the edge detection circuit 115b, the data sampling circuit 120b, and the phase mixer 145b, but lacking a phase multiplexer. The clock source 130 generates a clock signal 132 including component clock signals having a phase offset with respect to each other and provides the clock signal 132 to data receiver 105a. In addition to receiving the clock signal 132 (e.g., clock signals 132a-b), each of the data receivers 105 (e.g., data receivers 105a-b) receives a corresponding input data stream 110 (e.g., input data streams 110a-b) and generates a corresponding output data stream 125 (e.g., output data streams 125a-b) based on the corresponding input data stream 110 and clock signal 132. In contrast to the embodiments illustrated in FIGS. 1A and 1B, only in the data receiver 105a, the phase multiplexer 135a receives the clock signal 132 and selects two or more of the component clock signals 140a and 140b of the clock signal 132, for example based on a digital user input control signal (e.g., a Gray code). The phase multiplexer 135a in the data receiver 105a transmits the selected component clock signals 140a and 140b to the phase mixers 145a and 145b, respectively. In this embodiment the receiver system 100 utilizes only one phase multiplexer 135a across multiple channels, 110a and 110b, and thus reduces power consumption. The choice of phase offsets and mixing thereof is accomplished on a per channel basis in the respective phase mixers 145a and 145b.

Different embodiments of the receiver system 100 can use any type of clock-data-recovery (CDR), including but not limited to, a voltage controlled oscillator (VCO) baseline.

Phase Mixing and Traversing

Figure 2:
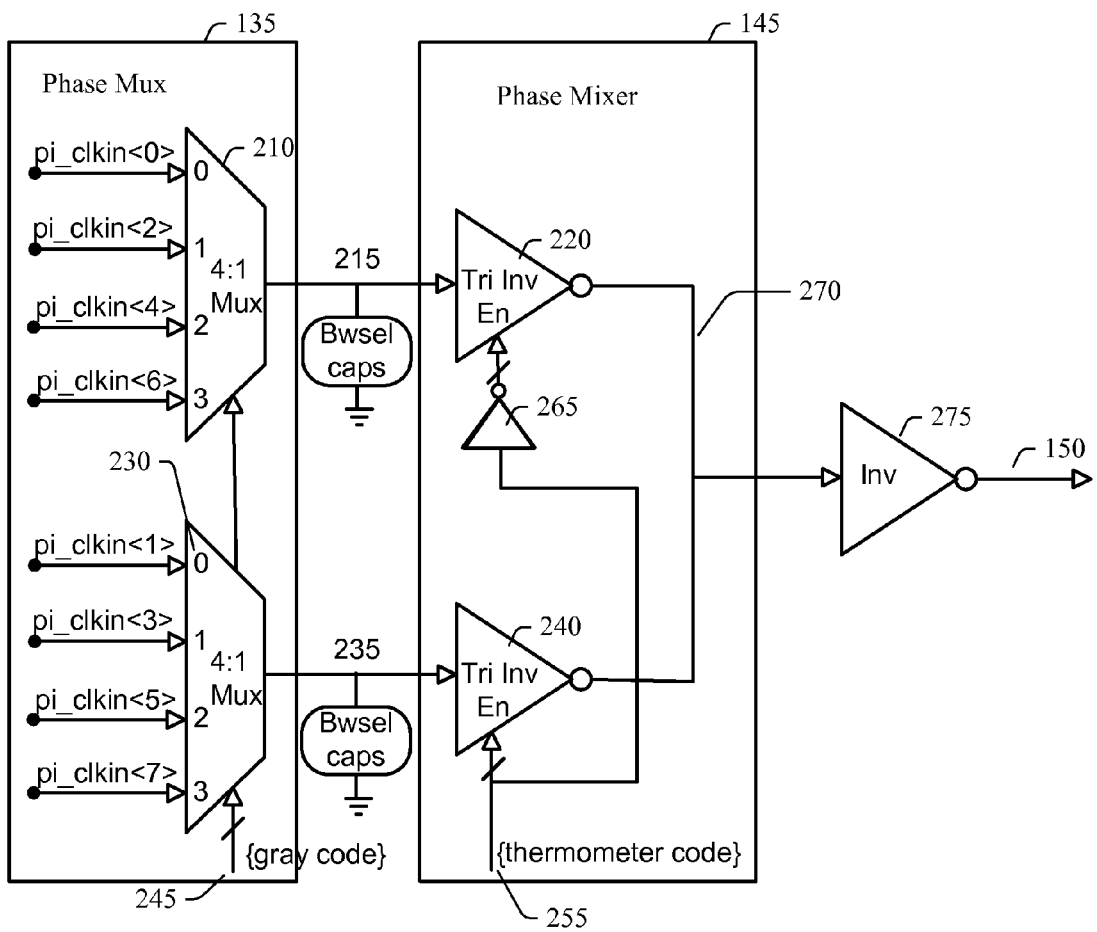
FIG. 2 illustrates a circuit diagram of phase interpolator signal path involving a phase multiplexer (mux) and phase mixer to generate a phase-shifted output signal with respect to an input clock signal (pi_clkin) in accordance with an example embodiment.
Figure 3:
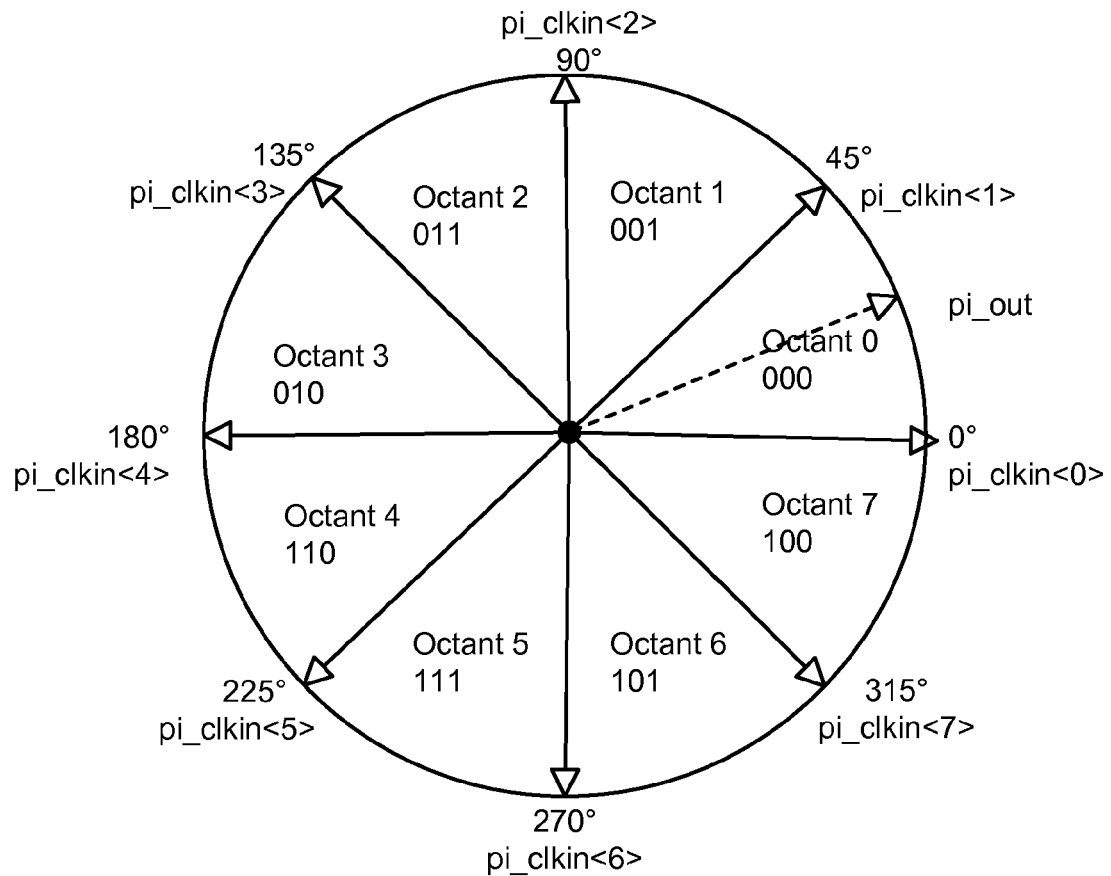
FIG. 3 illustrates phase mapping on octants of the unit circle in accordance with an example embodiment.

Referring now to FIG. 2, a phase multiplexer (Phase MUX) 135 and a phase mixer 145 are illustrated in accordance with an example embodiment. FIG. 3 shows, according to this embodiment, the octant mapping diagram of the component clock signal phase vectors and the single phase output clock signal phase vector, from the phase multiplexer 135 and the phase mixer 145 shown in FIG. 2, respectively. The phase multiplexer 135 in FIG. 2 comprises two 4:1 multiplexers 210 and 230, each selecting from four different phase-shifted component clock signals of the clock signal 132. The 4:1 multiplexer 210 selects from the four component clock signals labeled pi_clkin<0>, pi_clkin<2>, pi_clkin<4>, and pi_clkin<6>, whereas the other multiplexer 230 selects from pi_clkin<1>, pi_clkin<3>, pi_clkin<5>, and pi_clkin<7>, respectively. Each phase-shifted component clock signal represents a different octant phase, which include four even phases 0°, 90°, 180° and 270° and four odd phases 45°, 135°, 225° and 315° as illustrated in FIG. 3. Each multiplexer passes their selected component clock signal to their corresponding output line (215 and 235). More specifically the output line 215 represents the even phases of the input clock cycle of the clock signal 132, whereas the output line 235 represents the odd phases. In general, a multiplexer has N select input lines from which it selects one input line and passes the selected line to its corresponding output line. Therefore, embodiments of the present invention are not limited to only an octant representation of the input clock cycle, but can include any number of phase increments of the 360°-phase cycle. More generally, embodiments comprise a N:1 multiplexer 210 and a M:1 multiplexer 230, where N and M represent natural numbers.

TABLE 1

Gray code selected odd and even phases of the octant map representation

| Octant No. | Gray Code | Odd Phase | pi_clkin no. | Even Phase | pi_clkin no. |
|---|---|---|---|---|---|
| 0 | 000 | 45° | <1> | 0° | <0> |
| 1 | 001 | 45° | <1> | 90° | <2> |
| 2 | 011 | 135° | <3> | 90° | <2> |
| 3 | 010 | 135° | <3> | 180° | <4> |
| 4 | 110 | 225° | <5> | 180° | <4> |
| 5 | 111 | 225° | <5> | 270° | <6> |

TABLE 1-continued

Gray code selected odd and even phases
of the octant map representation

| Octant No. | Gray Code | Odd Phase | pi_clkin no. | Even Phase | pi_clkin no. |
|---|---|---|---|---|---|
| 6 | 101 | 315° | <7> | 270° | <6> |
| 7 | 100 | 315° | <7> | 0° | <0> |

In one example embodiment each 4:1 multiplexer 210 and 230 bases its selection on a 3-bit Gray digital code transmitted through the user input control signal line 245. In Table 1 a particular Gray code corresponds to a selected component clock signal and its corresponding phase. In another embodiment, a 2-bit code would suffice to encode the selection for each 4:1 phase multiplexer, whereas yet another embodiment comprises two 8:1 phase multiplexer, each multiplexer utilizing a 3-bit selection code. Furthermore, the signal output lines 215 and 235 of each phase multiplexer are capped by a bandwidth selector before connected to a three-state logic inverter 220 and 240, respectively. The three-state logic inverter 220 and 240 provide 16 equally sized instances to weight each phase of the selected component clock signal of lines 215 and 235, where the weight is adjusted using a variable resistance buffer. The buffers are controlled by a 16-bit thermometer code as part of the user input control signal 255 that provides the enable state for the inverter 240, whereas the thermometer code of the control signal 255 is inverted by the inverter 265 before providing the enable state for the inverter 220. The individual weights for each thermometer code are listed in Table 2.

TABLE 2

Thermometer code and phase weights

| Thermometer Code | Odd Phase Weight | Even Phase Weight |
|---|---|---|
| 0  | 0000 0000 0000 0000 | 1111 1111 1111 1111 |
| 1  | 1000 0000 0000 0000 | 0111 1111 1111 1111 |
| 2  | 1100 0000 0000 0000 | 0011 1111 1111 1111 |
| 3  | 1110 0000 0000 0000 | 0001 1111 1111 1111 |
| 4  | 1111 0000 0000 0000 | 0000 1111 1111 1111 |
| 5  | 1111 1000 0000 0000 | 0000 0111 1111 1111 |
| 6  | 1111 1100 0000 0000 | 0000 0011 1111 1111 |
| 7  | 1111 1110 0000 0000 | 0000 0001 1111 1111 |
| 8  | 1111 1111 0000 0000 | 0000 0000 1111 1111 |
| 9  | 1111 1111 1000 0000 | 0000 0000 0111 1111 |
| 10 | 1111 1111 1100 0000 | 0000 0000 0011 1111 |
| 11 | 1111 1111 1110 0000 | 0000 0000 0001 1111 |
| 12 | 1111 1111 1111 0000 | 0000 0000 0000 1111 |
| 13 | 1111 1111 1111 1000 | 0000 0000 0000 0111 |
| 14 | 1111 1111 1111 1100 | 0000 0000 0000 0011 |
| 15 | 1111 1111 1111 1110 | 0000 0000 0000 0001 |
| 16 | 1111 1111 1111 1111 | 0000 0000 0000 0000 |

The thermometer code controls both buffers, but since it is inverted by inverter 240, if one three-state inverter receives an enable code representing a weight of all 0s for one phase, the other inverter receives the corresponding weight of all 1s for the other phase. In this case, one phase would receive no weight, while the other phase would be fully weighted. Similarly, a thermometer code with a weight equaling "0000 0000 1111 1111" for inverter 240 would result in an enable state with a weight of "1111 1111 0000 0000" for inverter 220, resulting in the phases given equal weight. The odd and even phase inverted output signals from inverters 220 and 240 are then 270 combined and inverted back by inverter 275 to yield the single phase clock signal 150 (pi_out). The Gray and thermometer code encode the amount by which the phase of the single phase clock signal 150 is shifted in reference to the phase of the clock source 130. FIG. 3 shows the phase (pi_out) of the phase-shifted single phase clock signal 150 generated in response to a Gray code of "000" and thermometer code of "8," where the "pi_out" phase vector dissects the octant no. 0 of the octant map representation on the unit circle.

The resolution of the embodiment shown in FIG. 2 is 1:64 over a unit interval (UI) of 100 ps by being configured to generate 128 phase states over two UIs. Thus, for a 200 ps cycle period of clock signal the step size (phase offset) equals 1.5625 ps for this particular embodiment. It is noted that the disclosed embodiments can have higher or lower resolutions. Alternative embodiments can include, but are not limited to, a larger number of weights or, as stated above, different phase increments of the 360°-phase cycle.

Figure 4A:
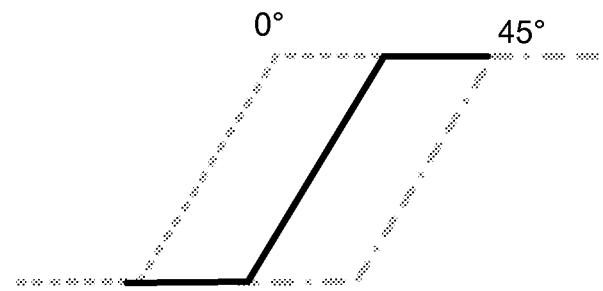
FIGS. 4A, 4B and 4C illustrate different signals generated using phase mixing in the phase interpolator, in accordance with an example embodiment.
Figure 4B:
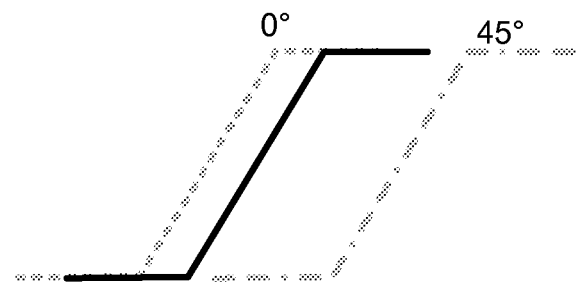
Figure 4C:
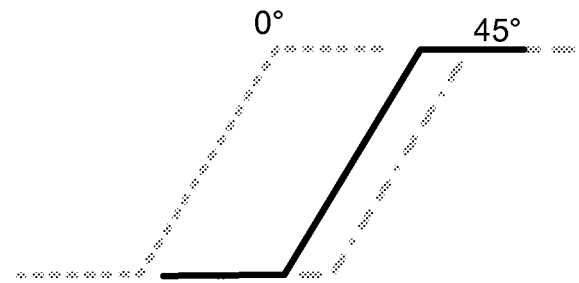

FIGS. 4A-4C, 5A-5B, and 6A-6B are illustrations of the different signals generated using phase mixing in the phase interpolator, in accordance with an example embodiment. More specifically, FIGS. 4A, 4B and 4C show phase mixing that utilizes a Gray code of "000." The phases of the selected component clock signals in lines 235 and 215, respectively, are shown in Gray with the dashed line representing the even phase of 0° and the dashed-dotted line indicating the odd phase of 45°. The phase of the single phase clock signal 150 (output phase of the phase mixer 145) is shown in FIG. 4A as the black solid line that results from the thermometer code of "8," which equally weighs both phases of the selected component clock signals. FIG. 4B illustrates an embodiment of a thermometer code of "4" that weighs the 0°-phase more heavily than the 45°-phase, while the output phase of phase mixer 145 further increases towards the 45°-phase for thermometer code of "12" as shown in FIG. 4C.

Figure 5A:
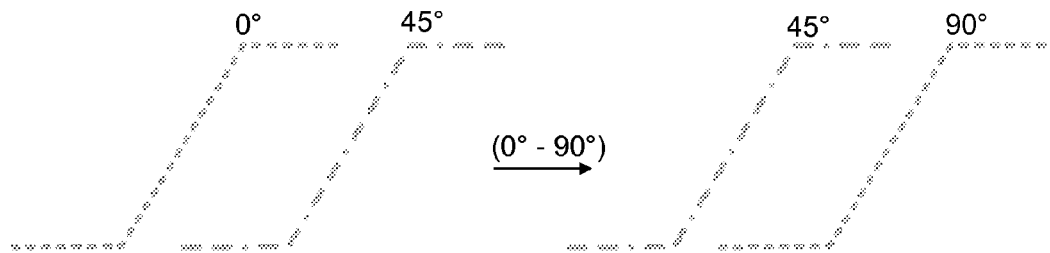
FIGS. 5A and 5B illustrate different signals generated using phase traversing in the phase interpolator, in accordance with an example embodiment.
Figure 5B:
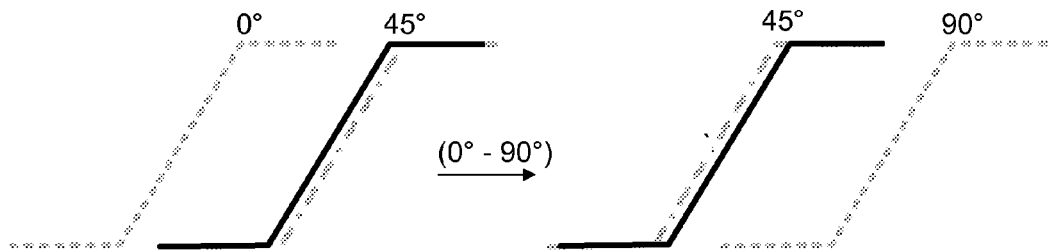

Phase traversing (crossing) occurs, when the phase output of the phase mixer 145 keeps increasing and one of the phase multiplexers, 210 or 245, eventually needs to switch to a component clock signal with different phase. The phase of the newly selected component clock signal, the new input phase to the phase mixer, is part of a neighboring phase octant on the unit circle. FIGS. 5A and 5B illustrate the phase traversing that occurs when the odd input phase switches from 0° to 90°, transitioning from the octant no. 0 to the octant no. 1 on the unit circle. The transition is controlled by changing the Gray code from "000" to "001" resulting in the phase multiplexer 210 selecting pi_clkin<2> representing the 90°-phase instead of the 0°-phase of pi_clkin<0> and 215 transmitting the 90°-phase to the three-state inverter 220. If the thermometer code stays constant during the traversing of the input phases, the corresponding weight ratio in the output phase for the 90°/45° phase signal is the same ratio as for the 0°/45° phase signal. FIG. 5B shows the traversing from 0°-phase to 90°-phase with a thermometer code of "15" that yields an output phase close to the 45°-phase.

In contrast to keeping the thermometer code constant, changing the thermometer code and Gray code sequentially can result in overshooting or undershooting the desired output phase. Overshooting applies to increasing the phase value in the output signal and means that the mixing yields an output phase of an intermediate clock signal that is larger in value than the final desired output phase, whereas undershooting concerns decreasing the output phase value and occurs when the output phase of an intermediate clock signal is smaller than the desired final phase signal.

Figure 6A:
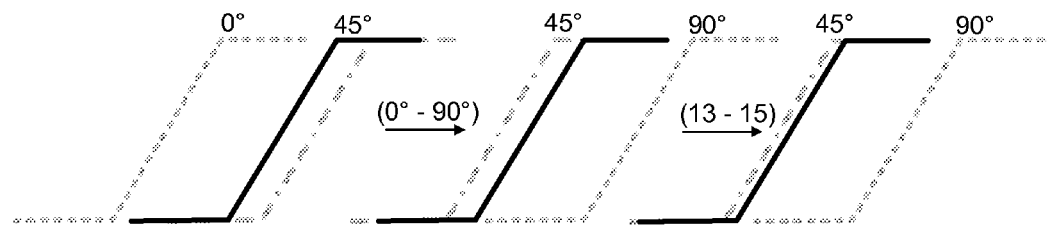
FIGS. 6A and 6B illustrate different signals generated using phase traversing in the phase interpolator, in accordance with an example embodiment.
Figure 6B:
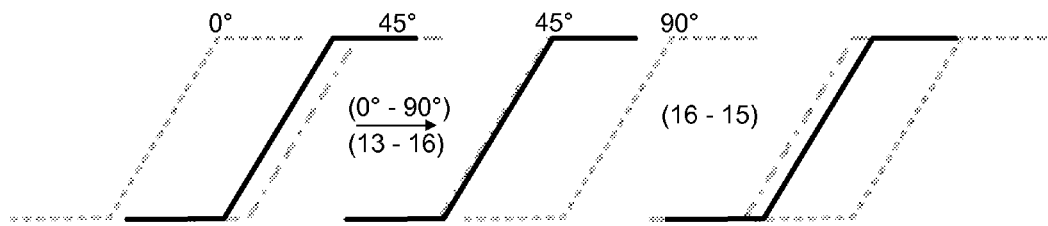

FIGS. 6A and 6B illustrate this problem of overshooting a desired output phase signal and a remedy to this problem by utilizing an embodiment of the present invention, respectively. More specifically, in FIG. 6A the output phase signal is obtained by sequentially changing the Gray code from "000" to "001" and the thermometer code from "13" to "15." The desired output phase is the mixing of 45°-phase and 90°-phase, each phase weighted by a buffer represented by the 16-bit thermometer code of "1111 1111 1111 1000" and "0000 0000 0000 0111," respectively. This sequential code change implies traversing the even input phase from 0° to 90° while subsequently shifting the output phase closer to the 45°-phase, weighing the 45°-phase more heavily. This example demonstrated the overshooting effect that occurs when the output phase of the intermediate clock signal after changing the Gray code from "000" to "001" possesses a larger phase value than the desired output signal when changing the thermometer code from "13" to "15" as the phase shifts closer to the 45°-phase, decreasing the output phase value. One benefit of the present invention is to provide solutions to the problems of over- or undershooting the desired output phase.

According to one embodiment, a possible solution to diminish the likelihood of overshooting would be to alter the order of changing the Gray and thermometer codes, first changing the thermometer code from "13" to "15" followed by a change of the Gray code from "000" to "001." However, misalignments in the logic driving the phase interpolator might make this solution difficult to implement.

In comparison, another embodiment that would prevent overshooting in this example is represented by octant traversing through the corresponding octant phases (0°, 45°, 90°, . . . ) 315° by temporarily encoding the thermometer code to change to a value of "0" or "16," aligning the output phase of the intermediate clock signal with the octant phase that is traversed (not changed) during the phase traversing in the phase interpolator. FIG. 6B illustrates the phase traversing of the 45°-phase by temporarily encoding a thermometer code of "16" that ensures that the output phase of the intermediate clock signal is aligned with the 45°-phase before the thermometer code is subsequently changed from "16" to "15," thereby increasing the output phase even further without overshooting the desired phase.

Additional Configuration Considerations

Benefits and advantages of the disclosed configurations include, but are not limited to, providing solutions to the problems of over- or undershooting a desired output clock signal phase of a phase interpolator. Other benefits of the disclosed configurations include a low power consuming and digitally controlled solution of a phase interpolator that can be utilized in the context of delay-locked loops (DLLs) circuitry.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as illustrated in FIGS. 1A-1C and 2. Modules may constitute either software modules (e.g., code embodied on a machine-readable medium or in a transmission signal) or hardware modules. A hardware module is tangible unit capable of performing certain operations and may be configured or arranged in a certain manner.

In example embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The performance of certain of the operations may be distributed among the one or more processors, not only residing within a single machine, but deployed across a number of machines. In some example embodiments, the one or more hardware modules may be located in a single geographic location (e.g., within a home environment, an office environment, or a server farm). In other example embodiments, the one or more hardware modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, nonvolatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for utilizing a phase interpolator with octant traversing for a delayed-lock loop through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for phase-traversing from an initial clock signal to a final output clock signal, comprising:
    providing the initial clock signal having a phase comprising weighted phases of a first and second component clock signal, each component clock signal originating from a common clock source, the phase of the first component clock signal weighted by weight1, and the phase of the second component clock signal weighted by (1-weight1);
    providing a third component clock signal originating from the common clock source, and having a phase that is opposite to the phase of the first component clock signal relative to the phase of the second component clock when the phases of the component clock signals are mapped onto a unit circle;
    generating an intermediate clock signal having a phase comprising the phase of the second component clock signal; and
    generating the final output clock signal having a phase comprising the weighted phases of the second and third component clock signal, the phase of the second component clock signal weighted by weight2, and the phase of the third component clock signal weighted by (1-weight2).

2. A method for phase-traversing from an initial clock signal to a final output clock signal, comprising:
    providing the initial clock signal having a phase comprising a phase of a first component clock signal weighted by a first factor and a phase of a second component clock signal weighted by a second factor;
    providing a third component clock signal having a phase opposite to the phase of the first component clock signal relative to the phase of the second component clock signal when the phases of the component clock signals are mapped onto a unit circle;
    generating an intermediate clock signal having a phase of the second component clock signal; and
    generating the final output clock signal having a phase comprising a phase of the second component signal weighted by a third factor and a phase of the third component clock signal weighted by a fourth factor.

3. The method of claim 2, wherein the absolute difference between the phases of first and second component clock signal is approximately equal to absolute difference between the phases of the second and third component clock signal.

4. The method of claim 2, wherein the second factor equals the difference of one minus the first factor.

5. The method of claim 2, wherein the fourth factor equals the difference of one minus the third factor.

6. The method of claim 2, further comprising a plurality of component clock signals originating from a common clock source, wherein the plurality of component clock signals comprises the first, second, and third component clock signal.

7. The method of claim 6, wherein the plurality of component clock signals consists of eight component clock signals, each component clock signal having a different octant phase.

8. The method of claim 7, wherein each octant phase is selected from a group consisting of 0°, 45°, 90°, 135°, 180°, 225°, 270° and 315°.

9. A phase interpolator for traversing phases of a plurality of component clock signals from a common clock signal with each component clock signal having a different phase-offset to the common clock signal, the phase interpolator comprising:
    two phase multiplexers configured to receive the plurality of component clock signals and a Gray code; and
    a phase mixer coupled to the two phase multiplexers and configured to receive a thermometer code, each phase multiplexer transmitting, in response to the Gray code, one signal of the plurality of component clock signals to the phase mixer such that the phases of the two transmitted signals are adjacent to each other when mapping the phases of the plurality of component clock signals onto a unit circle, and the phase mixer, in response to the thermometer code, weighing each of the two transmitted signals and combining the weighted signals to generate a single phase clock signal, the phase mixer further comprising two three-state inverters, the first three-state inverter configured to receive the thermometer code and one of the two transmitted signals from the phase multiplexers and to generate a first weighted output signal, and the second three-state inverter configured to receive the inverted thermometer code and the second of the two transmitted signals and to generate a second weighted output.

10. The phase interpolator of claim 9, wherein each phase multiplexer comprises a 4:1 multiplexer.

11. The phase interpolator of claim 9, wherein the Gray code comprises a three-bit code and the thermometer code comprises a 16-bit code.

12. The phase interpolator of claim 9, further comprising an inverter, the inverter coupled to the two three-state inverters and configured to receive the first and second weighted signal that are generated by the two three-state inverters and to combine the first and second weighted signal to generate the single phase clock signal.

13. The phase interpolator of claim 9, wherein the plurality of component clock signals consists of eight component clock signals, each component clock signal having a different octant phase.

14. A system comprising:
a clock source;
a phase interpolator coupled to the clock source, the phase interpolator comprising:
  two phase multiplexers configured to receive a Gray code and a plurality of component clock signals from a common clock signal with each component clock signal having a different phase-offset to the common clock signal, and
  a phase mixer coupled to the two phase multiplexers and configured to receive a thermometer code, each phase multiplexer transmitting, in response to the Gray code, one signal of the plurality of component clock signals to the phase mixer such that the phases of the two transmitted signals are adjacent to each other when mapping the phases of the plurality of component clock signals onto a unit circle, and the phase mixer, in response to the thermometer code, weighing each of the two transmitted signals and combining the weighted signals to generate a single phase clock signal;

a delay-locked loop coupled to the phase interpolator;
an edge detection circuit coupled to the delay-locked loop and configured to receive a input data stream; and
a data sampling circuit coupled to the delay-locked loop and to the edge detection circuit, the delay-locked loop configured to receive from the phase interpolator a single phase clock signal, the single phase clock signal based on a signal from the clock source and user input control signals, and configured to transmit clock signal pairs to the edge detection circuit and the data sampling circuit,
the edge detection circuit based on the clock signal pair and the input data stream and configured to transmit a recovered clock signal and the input data stream to the data sampling circuit, and
the data sampling circuit based on the clock signal pair and the recovered clock signal generating a delayed output data stream.

15. The system of claim 14, wherein each phase multiplexer comprises a 4:1 multiplexer.

16. The system of claim 14, wherein the Gray code comprises a three-bit code and the thermometer code comprises a 16-bit code.

17. The system of claim 14, wherein the phase mixer comprises two three-state inverters, the first three-state inverter configured to receive the thermometer code and one of the two transmitted signals from the phase multiplexers and to generate a first weighted output signal, and the second three-state inverter configured to receive the inverted thermometer code and the second of the two transmitted signals and to generate a second weighted output.

18. The system of claim 17, wherein the phase interpolator further comprises an inverter, the inverter coupled to the two three-state inverters and configured to receive the first and second weighted signal that are generated by the two three-state inverters and to combine the first and second weighted signal to the single phase clock signal.

19. The system of claim 14, wherein the plurality of component clock signals consists of eight component clock signals, each component clock signal having a different octant phase.

* * * * *